United States Patent [19]

Laub

[11] Patent Number: 5,474,067
[45] Date of Patent: Dec. 12, 1995

[54] METHOD FOR TIME-RESOLVED MR-IMAGING

[75] Inventor: Gerhard Laub, Heroldsbach, Germany

[73] Assignee: Siemens Aktiengesellschaft, Munich, Germany

[21] Appl. No.: 282,502

[22] Filed: Aug. 1, 1994

[30] Foreign Application Priority Data

Aug. 13, 1993 [DE] Germany .................. 43 27 325.4

[51] Int. Cl.$^6$ .................................................. A61B 5/055
[52] U.S. Cl. .................. 128/653.2; 128/653.3; 128/708; 324/306; 324/309
[58] Field of Search .................. 128/653.2, 653.3, 128/696, 708; 324/306, 309

[56] References Cited

U.S. PATENT DOCUMENTS

| | | |
|---|---|---|
| 4,710,717 | 12/1987 | Pelc et al. . |
| 4,767,991 | 8/1988 | Rzedzian . |
| 5,031,624 | 7/1991 | Mistretta et al. . |
| 5,042,485 | 8/1991 | Sano et al. . |
| 5,054,489 | 10/1991 | Axel et al. . |
| 5,329,925 | 7/1994 | Nessaiver .................. 128/653.3 |
| 5,377,680 | 1/1995 | Bernstein et al. .................. 128/653.2 |

FOREIGN PATENT DOCUMENTS 0115642   12/1983   European Pat. Off. .

OTHER PUBLICATIONS

"Cineangiography of the Heart in a Single Breath Hold with a Segmented TurboFLASH Sequence," Atkinson et al., Radiology, vol. 178(1991) pp. 357–360.
"Keyhole Imaging Offers Shortcut to Fast MR Scans," Casey, Diagnostic Imaging, Feb. 1993, p. 36.

*Primary Examiner*—Ruth S. Smith
*Attorney, Agent, or Firm*—Hill, Steadman & Simpson

[57] ABSTRACT

For time-resolved MR imaging, magnetic resonance signals obtained from a subject are entered row-by-row into a raw data matrix divided into individual segments, the signals being acquired by excitation and phase coding of nuclear spins in the subject. An image is produced from every raw data matrix completely occupied with rows. A number of images are obtained by acquiring a number of raw data matrices at different times of a motion sequence. Signals of at least one segment are employed for two chronologically successive raw data matrices. The measuring time can thus be shortened.

7 Claims, 11 Drawing Sheets

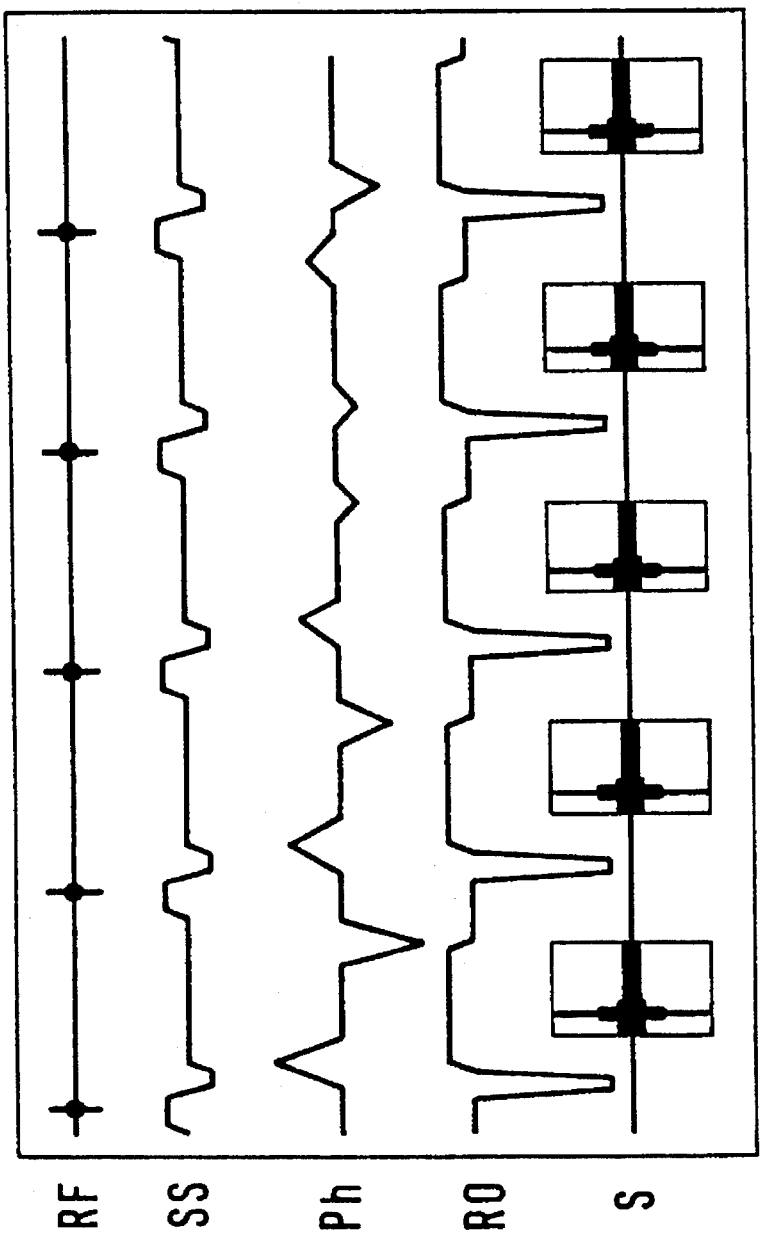

METHOD FOR TIME-RESOLVED MR-IMAGING

FIELD OF THE INVENTION

The invention is directed to a method for time-resolved imaging of a subject with nuclear magnetic resonance signals obtained from the subject, of the general type of imaging method wherein nuclear spins are excited, phase-encoded, and the arising signals are read out and entered according to their phase-encoding into respective rows of a raw data matrix divided row-by-row into individual segments, and wherein an image is produced from a raw data matrix completely occupied with rows, with a plurality of images being acquired at different points in time of a motion sequence of the subject.

DESCRIPTION OF THE PRIOR ART

A method of the type generally identified above is known from "Cineangiography of the Heart in a Single Breath Hold with A Segmented TurboFLASH Sequence," Atkinson et al. Radiology 1991, pages 357–360. The presentation of motion sequences in the fashion of a film, referred to as a "cine study," composed of a plurality of MR images has high diagnostic value in many instances. The registration speed even given currently-available, fast MR imaging methods, however, is not adequate for rapidly sequencing events, for example the motion of the heart, in order to register the number of images required for an image sequence in real time. In periodic events, for example in heart examinations, however, a heartbeat period can be divided into a plurality of motion phases and measuring events can be respectively started with trigger signals derived from an ECG measurement. In conventional measuring methods, one row of a raw data matrix is then filled for each motion phase at each heartbeat period. For registering complete images, one then requires a plurality of heartbeats corresponding in number to the plurality of rows of the raw data matrix.

The aforementioned article by Atkinson et al. discloses a pulse sequence wherein the raw data matrix is segmented and a plurality of rows of a raw data matrix are acquired in every motion phase of a heartbeat, these rows being allocated to the segments. The measuring time can thus be shortened. Longer motion phases, cardiac phases in this case, must be selected, however, since a longer time is required for measuring each individual cardiac phase. The plurality of cardiac phases per cardiac period thus becomes correspondingly smaller. This leads to a reduction of the chronological resolution within a cardiac period.

The article "Keyhole Imaging Offers Shortcut to Fast MR Scans", in Diagnostic Imaging, February 1993, page 36, discloses that the data acquisition time can be shortened in that measurement is only made for a reference image of the entire K-space, whereas only a central part of the K-space is measured in all following raw data matrices. This method is suitable for contrast measurements wherein the anatomy is stationary.

SUMMARY OF THE INVENTION

An object of the invention is to provide a method of the type initially cited such that the measuring time for motion events is shortened without losses in the chronological resolution having to be accepted.

The above object is achieved in accordance with the principles of the present invention in a method for time-resolved imaging using nuclear magnetic resonance signals obtained by exciting nuclear spins in a subject, phase-encoding the spins, and reading out the nuclear magnetic resonance signals according to their phase-encoding, and entering the signals which have been read out into respective rows of a raw data matrix divided into individual segments. An image is produced from the raw data matrix which is completely filled with rows in this manner, and a plurality of raw data matrices are acquired at different times of a motion sequence. The signals of at least one segment are employed in common for two chronologically successive raw data matrices, thereby decreasing the overall amount of data, and thus shortening the time required to obtain that data, to generate a satisfactory image. The total number of segments, and the number of segments which are employed in common in successive raw data matrices can be varied dependent on the particular application.

DESCRIPTION OF THE DRAWINGS

FIGS. 1–5 illustrate a standard FISP sequence for obtaining data in a nuclear magnetic resonance apparatus.

FIG. 10 illustrates the chronological course of a measurement conducted in accordance with the principles of the present invention, in a first embodiment.

FIG. 11 shows the chronological course of a measurement conducted accordance with the principles of the present invention, in a second embodiment.

FIG. 21 illustrates the use of flow measurement in combination with segmented data acquisition conducted in accordance with the principles of the present invention.

FIG. 22 illustrates the chronological course of data acquisition in a measuring sequence in accordance with the principles of the present invention for obtaining images of rapidly sequencing events.

DESCRIPTION OF THE PREFERRED EMBODIMENTS

Figure 6:
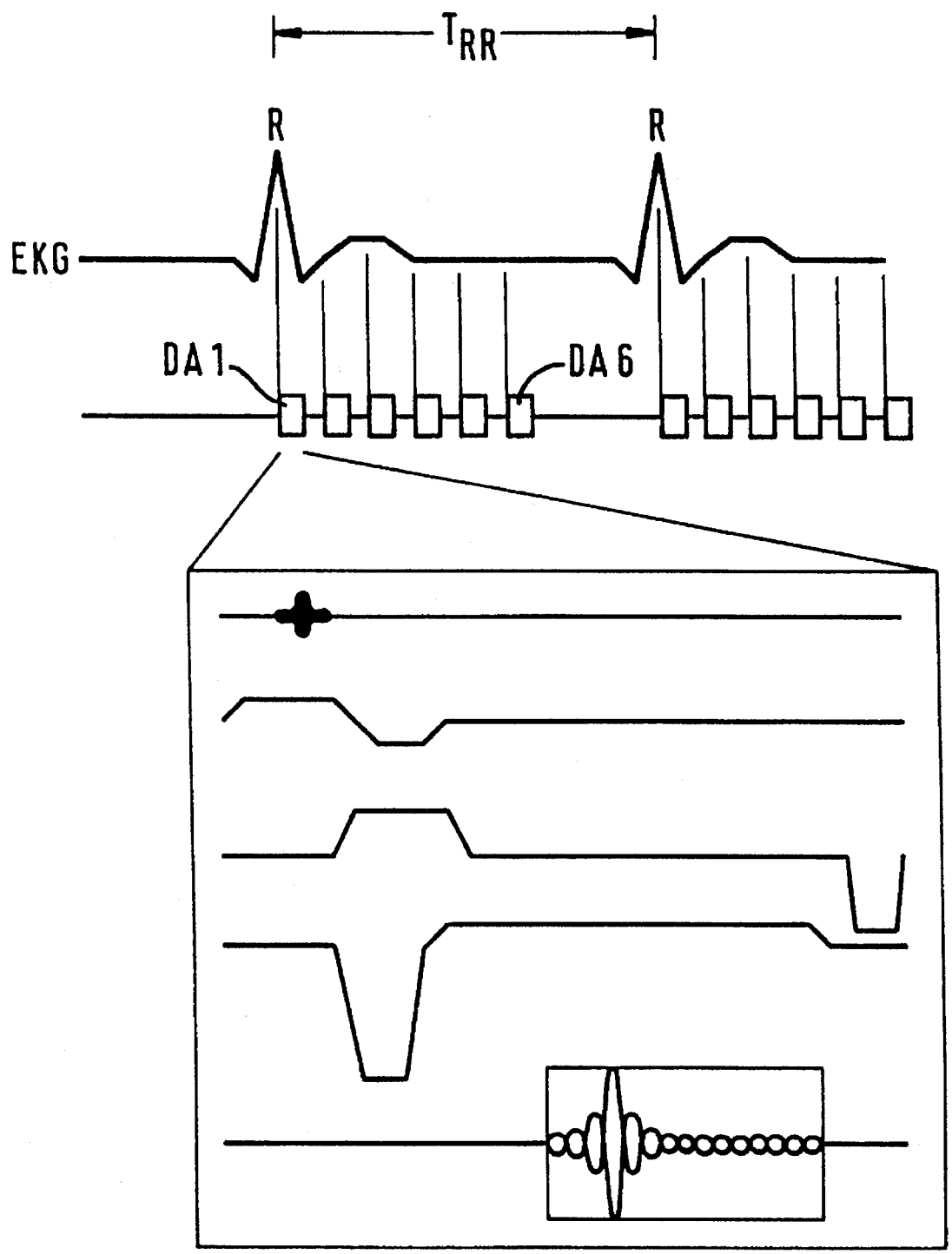
FIG. 6 illustrates conventional registration of data for a time-resolved acquisition of heart motion.

The method of the invention can be fundamentally implemented with any MR pulse sequence suitable for imaging. Of course, fast pulse sequences are especially suitable, such as, for example, the so-called FLASH sequence (see, for example, U.S. Pat. No. 4,707,658) or the so-called FISP sequence (see, for example, U.S. Pat. No. 4,769,603).

The FISP sequence shall be set forth in brief below with reference to FIGS. 1 through 5; a more detailed description may be found in U.S. Pat. No. 4,769,603. The nuclear spins of an examination subject aligned in a basic magnetic field are caused to precess due to a sequence of radio-frequency pulses RF according to FIG. 1. The radio-frequency pulses RF are emitted under the influence of a slice selection gradient SS according to FIG. 2, so that they act selectively on only one slice of the examination subject. Each positive pulse of the slice selection gradient SS is followed by a negative pulse, so that the dephasing caused by the positive pulse is in turn cancelled. A pulse of a phase-encoding gradient Ph is activated after every excitation, the amplitude/time area thereof changing from excitation pulse-to-excitation pulse. The nuclear spins are thus differently phase-encoded from excitation-to-excitation. A nuclear magnetic resonance signal S according to FIG. 5 is finally generated by a bipolar read-out gradient RO according to FIG. 4; this nuclear magnetic resonance signal S is read out under the effect of the positive part of each read-out gradient RO. The phase of the nuclear spins is in turn reset by a negative pulse of the phase-encoding gradient Ph after every nuclear magnetic resonance signal S and before the excitation.

The nuclear magnetic resonance signals S acquired in this way are sampled in the time domain, digitized, and the numerical values thus obtained are entered per nuclear magnetic resonance signal S into a row of a raw data matrix. The raw data matrix can be considered to be a measured data space, such as a measured data plane in the two-dimensional case present in the exemplary embodiment. This measured data space is generally referred to as "k-space" in nuclear magnetic resonance tomography.

The information about the spacial origin of the signal contributions S necessary for the imaging is coded in the phase information, whereby the mathematical relationship between the locus space (i.e., the image) and the k-space exists via the following two-dimensional Fourier transformation $$S(k_x, k_y) = \iint \rho(x, y) e^{i(k_x x + k_y y)} dx dy,$$

wherein:

$$k_x(t) = \gamma \int_0^t G_x(t') dt'$$

$$k_y(t) = \gamma \int_0^\tau G_y(t') dt'$$

wherein:

$\gamma$=the gyromagnetic constant $G_x(t')$=the gradient in the x-direction $G_y(t')$=the gradient in the y-direction $\rho$=the nuclear spin density, and $\tau$=the duration of the gradient $G_y$.

The sampling in the k-space ensues in successive rows by step-by-step changes of the phase-encoding gradient Ph according to FIG. 3.

An image matrix is acquired by two-dimensional Fourier transformation from the raw data matrix obtained in this way; an image reconstruction can then ensue on the basis of this image matrix.

It should be re-emphasized that the FISP method presented here represents only one of many possible sequences for the implementation of the time-resolved imaging of the invention.

For explaining the problem, FIG. 6 shows a conventional data registration for the time-resolved acquisition of heart motion. An ECG is thereby acquired and a respective measurement is triggered with the R-wave. Each cardiac period, i.e., the time between two R-waves, is divided into cardiac phases. A data acquisition window, such as the data acquisition windows DA1 through DA6 in the exemplary embodiment, is thereby allocated to each cardiac phase. An individual signal, i.e., a row of a raw data matrix, is acquired by a FISP sequence during each data acquisition window DA1 through DA6. When, thus, six cardiac phases are to be acquired, one obtains six signals in six data acquisition phases DA1 through DA6, these six signals being respectively allocated to a row of a raw data matrix for producing six successive images. By continuing the phase-encoding gradient, a respectively further row for each of the six images is acquired after the next R-wave of the ECG. The overall measuring time is defined by the product of the plurality N of rows of the raw data matrix and the average spacing $T_{RR}$ of two successive R-waves of the ECG. Given one to eight rows of the raw data matrix, one thus requires approximately one to eight seconds for a complete measurement. Since this usually cannot be implemented during a period when a patient is holding his breath, motion artifacts almost always arise.

Figure 7:
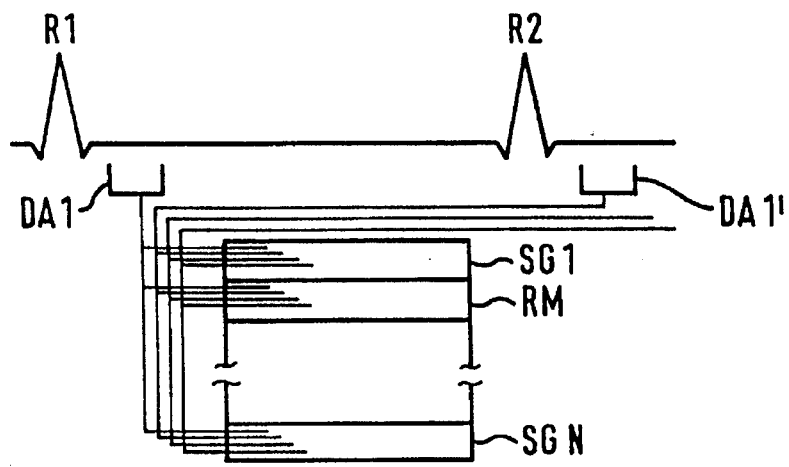
FIG. 7 illustrates a known technique for obtaining a sequence of magnetic resonance images for studying a physiological motion, known as the segmented k-space technique.

It is known from the aforementioned article by Atkinson et al. to rapidly measure a plurality of Fourier rows in succession within each and every cardiac phase for each of the images, and to then allocate these rows to segments of the raw data set with the corresponding cardiac phase. This method, referred to as segmented k-space technique, is schematically shown in FIG. 7. A plurality of differently phase-encoded signals is thereby acquired in every data acquisition window DA for the respective cardiac phases (for clarity, only the first data acquisition window DA1 is shown in FIG. 7). The raw data matrix RM is uniformly divided into a plurality of segments SG1–SGN. The respective first rows of each of the segments SGN are entered in the first data acquisition phase DA1 after the first R-wave R1; the respective second rows of each segment are entered in the first data acquisition phase DA1' after the second R-wave, etc. The sequence SGN for the images of the further cardiac phases are acquired in the same way, but with data acquisition windows that lie at a different spacing relative to the respective R-wave.

Figure 8:
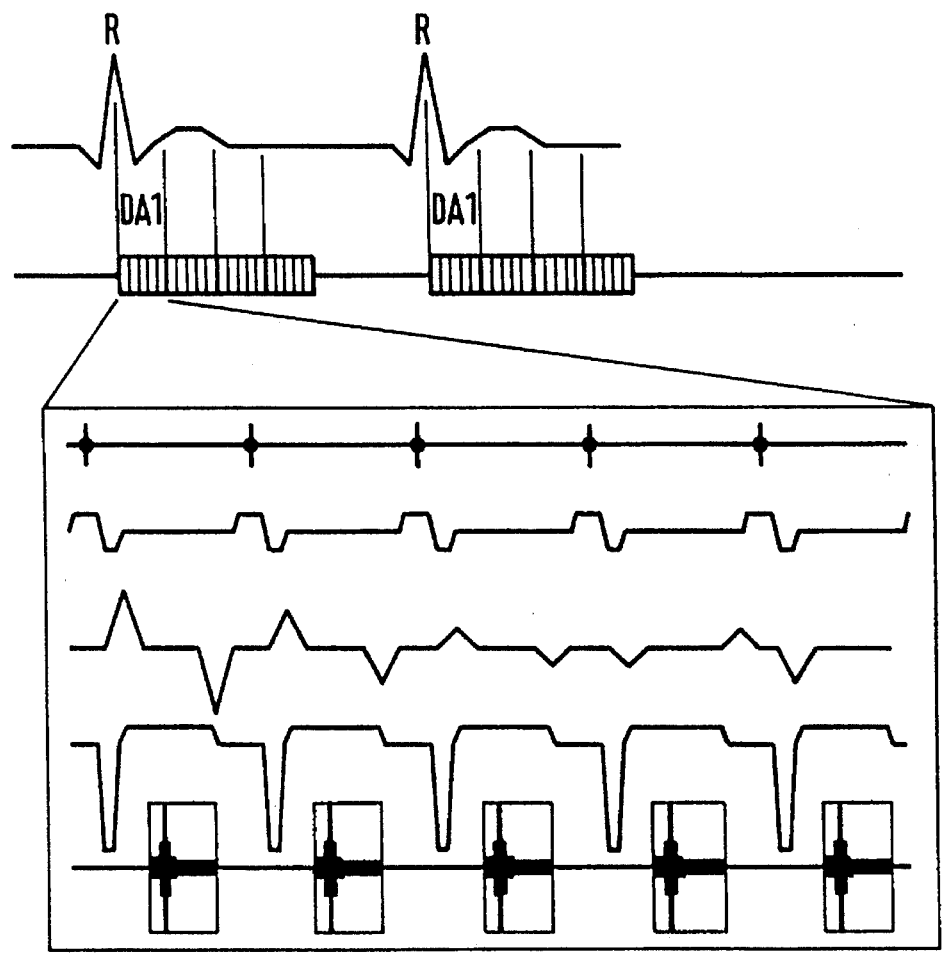
FIG. 8 schematically illustrates the allocation of a pulse sequence to a data acquisition phase according to the known segmented k-space technique of FIG. 7.

FIG. 8 schematically shows the allocation of a pulse sequence to the data acquisition phase DA1. Compared to FIG. 6, one can see that a plurality of excitations ensue during the data acquisition phase DA1, and a plurality of differently phase-encoded signals are acquired.

Figure 9:
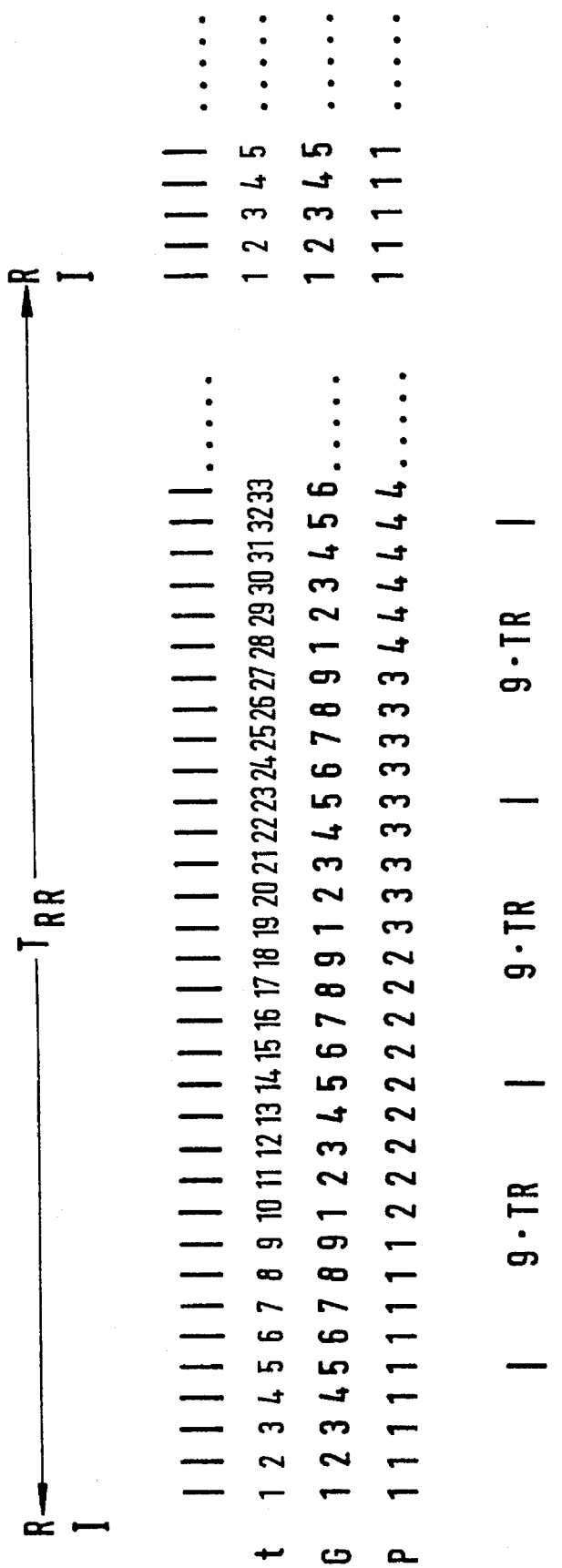
FIG. 9 illustrates the chronological course of a measurement according to the known segmented k-space technique.

FIG. 9 shows the chronological course of a measurement. The respective measuring times within a cardiac period $T_{RR}$ are entered on a time axis t. The allocation of the measurements to the k-space segments is designated SG and the allocation to the cardiac phase, or to an image in the image sequence, is designated HP. It is assumed that each raw data matrix is divided into nine segments. As may be seen from FIG. 9, for example, the first measurement is then allocated to the first segment of the first image corresponding to the first cardiac phase and the tenth measurement is allocated to the first segment of the second image corresponding to the second cardiac phase. The data acquisition phases, however, must be made longer corresponding to the number of measurements to be implemented per cardiac phase, or per any data acquisition phase. The cardiac period can thus be sub-divided into few cardiac phases. When, as in the exemplary embodiment for example, nine images with a repetition time TR are acquired per cardiac phase, or per data acquisition phase, then the shortest chronological spacing between successive cardiac phase images amounts to 9×TR. A chronological resolution of 90 ms or approximately 11 images per cardiac phase is thus obtained with the repetition times of approximately 10 ms that can be technically realized at present. This is, however, generally unsatisfactory for cardiological examinations. Although a reduction in the number of segments, and thus of the number of raw data rows acquired per cardiac phase leads to an improvement of the chronological resolution, it yields less of a reduction in measuring time. In general, the overall measuring time TA given a number of segments m is $TA = N \cdot T_{RR}/m$.

The implementation of "cine studies" within a single breath-holding cycle assumes a segment plurality of approximately nine.

Figure 10:
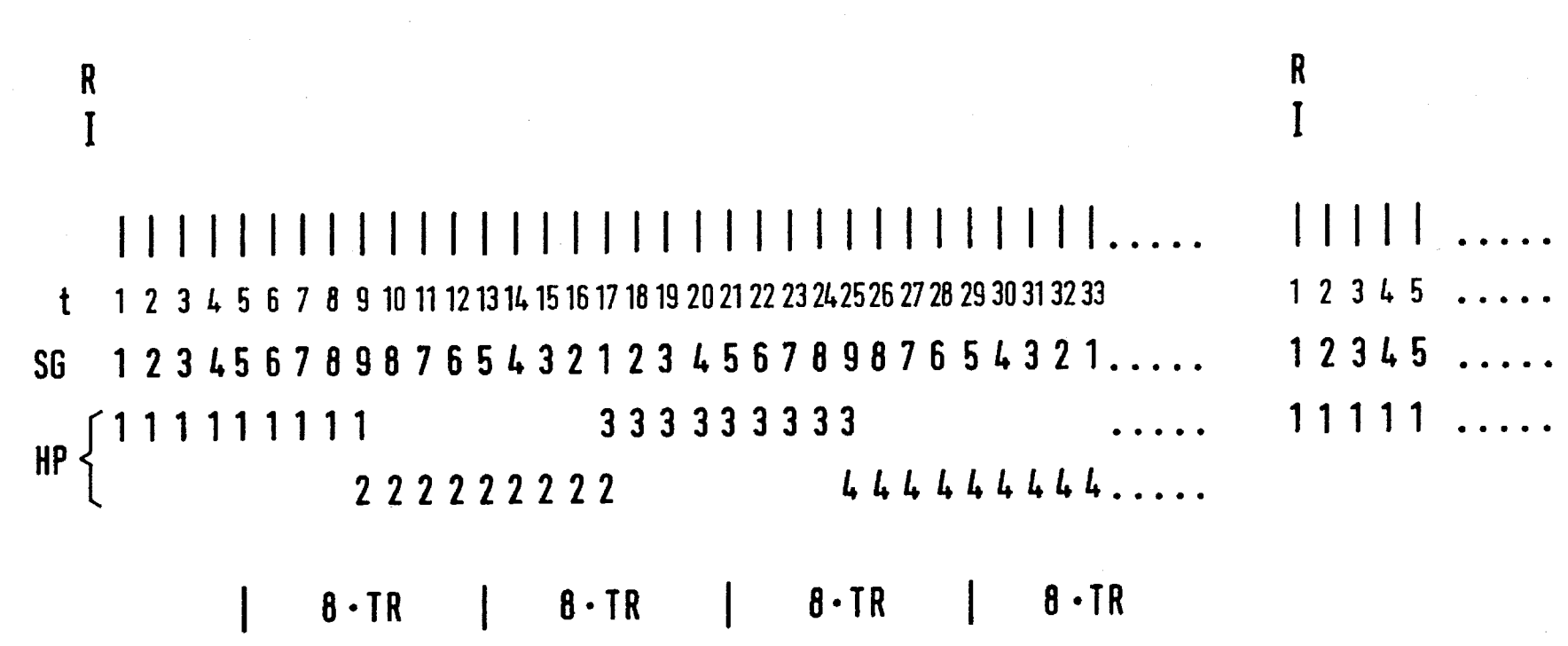

The invention proceeds on the concept of employing one or more signals S for the raw data rows of two successive images. FIG. 10 shows one possibility. The raw data matrix of each image is thereby also divided into nine segments SG. Differing from the prior art of FIG. 9, however, every ninth signal is now applied for two successive cardiac phase images. For example, the signal identified as number 9 is employed both for the ninth segment of the raw data matrix for the image of the first cardiac phase HP as well as for the ninth segment of the raw data matrix for the image of the second cardiac phase; signal number 17 is employed both for the first segment of the raw data matrix for the image of the second cardiac phase HP as well as for the first segment of the raw data matrix for the image of the third cardiac phase HP, etc. Given a repetition time TR of each pulse sequence, a time of 8 TR is thus required within a cardiac period per cardiac phase image compared to 9 TR in the prior art of FIG. 9. Correspondingly, more images can thus be accommodated per cardiac period, and thus the chronological resolution can be enhanced. Since it is primarily the middle raw data rows that are critical for the image contrast in Fourier transformation methods, the outer raw data rows acquired at later or earlier times have minimal influence on the chronological image resolution. The enhancement of the chronological resolution in the illustrated exemplary embodiment of FIG. 10, however, is relatively slight since only one data acquisition is saved in each cardiac phase.

Figure 11:
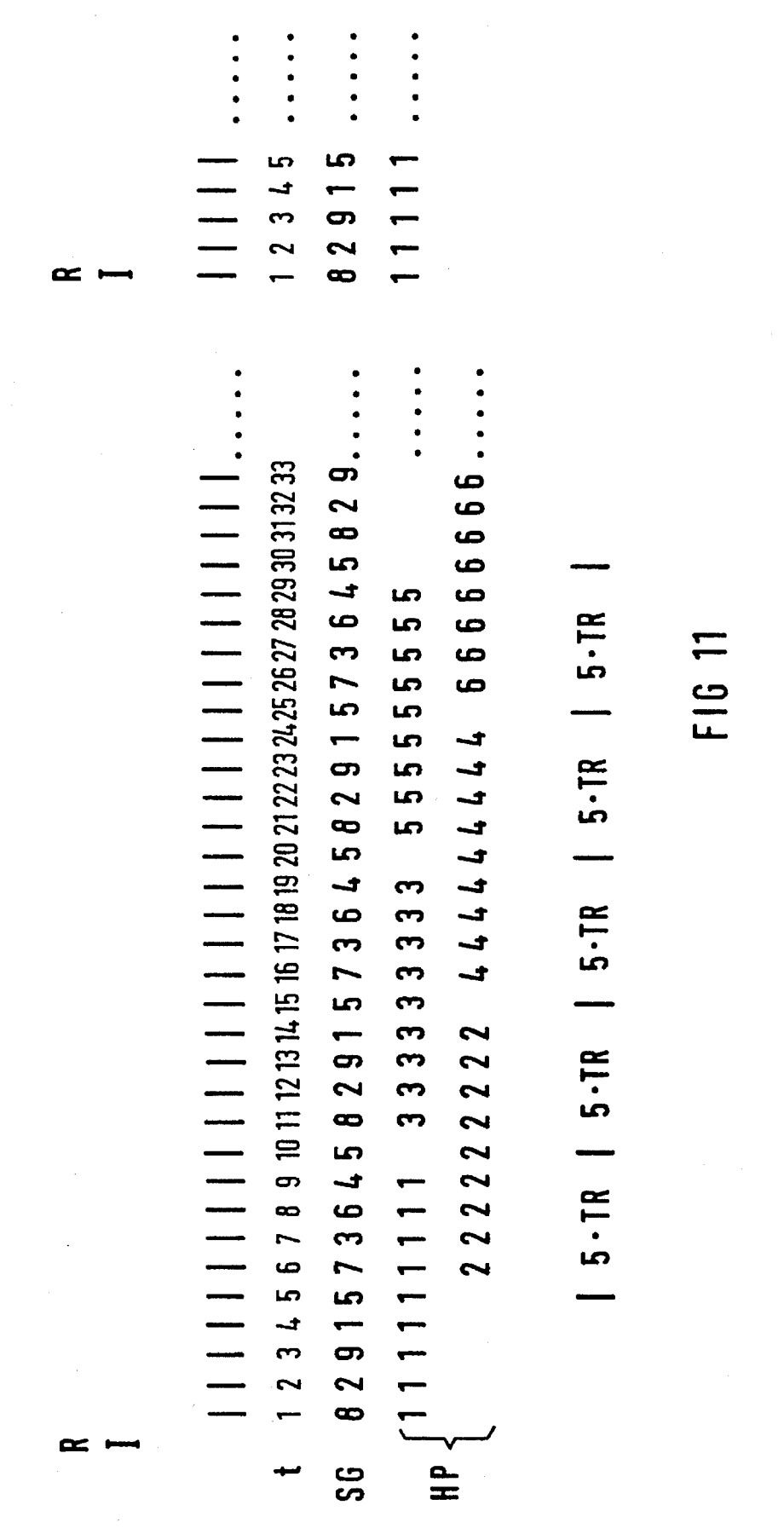
Figure 12:
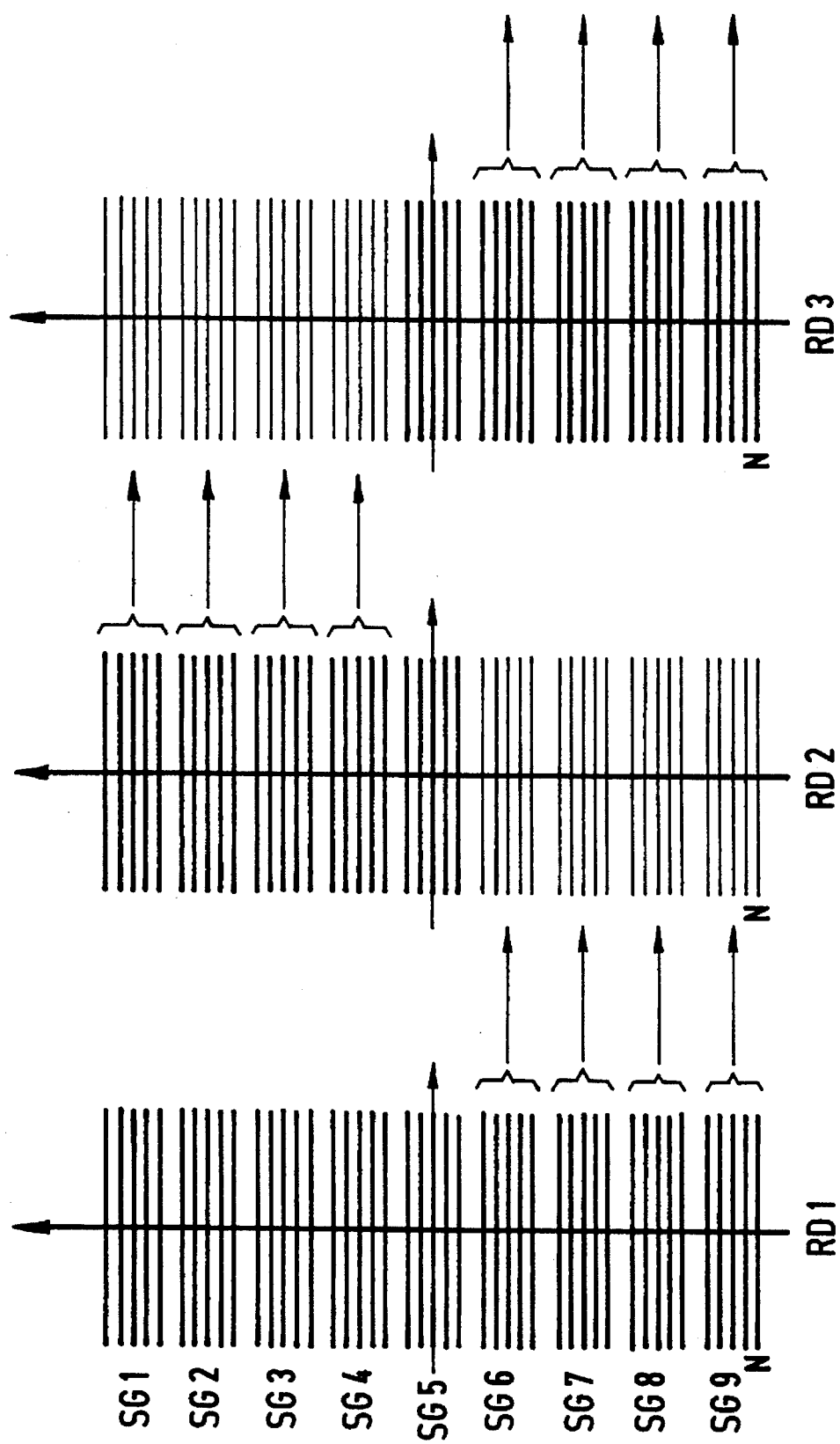
FIG. 12 schematically illustrates three raw data matrices obtained in accordance with the principles of the inventive method in the embodiment of FIG. 11.

A further improvement in the chronological resolution, however, is possible when not only one signal, but a plurality of signals, are employed in common for two successive cardiac phase images. FIG. 11 shows a corresponding exemplary embodiment. Four signals are thereby respectively employed for the raw data matrices of two successive cardiac phase images, i.e., for example, the signals 6–9 for the raw data matrices of the images of the first and second cardiac phase HP, the signals 11–14 for the raw data matrices of the images of the second and third cardiac phase etc. In this case, as recited in FIG. 11, only a repetition time of 5 TR per cardiac phase image is now required, so that the chronological resolution can be nearly doubled in comparison to the data acquisition of FIG. 9. For illustration, three raw data matrices RD1 through RD3 each having nine segments SG1 through SG9 are schematically shown in FIG. 12. For clarity, only five raw data rows are entered per segment. In practice, substantially more raw data rows will be provided in order, for example, to arrive at a total row number of the raw data matrices RT of 124. As indicated by the arrows in FIG. 12, the raw data rows of the raw data segments SG6 through SG9 of the raw data matrix RD1 are transferred into the corresponding segments SG6 through SG9 of the raw data matrix RD2. Correspondingly, the first segments SG1 through SG4 of the second raw data matrix RD2 are transferred into the corresponding segments of the third raw data matrix RD3.

Figure 13:
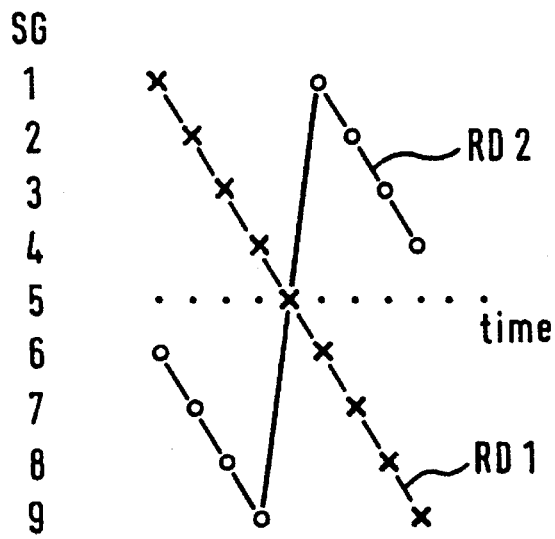
FIGS. 13 and 14 illustrate alternative ways to order the data acquisition times of the segments of two raw data matrices in accordance with the inventive method.
Figure 14:
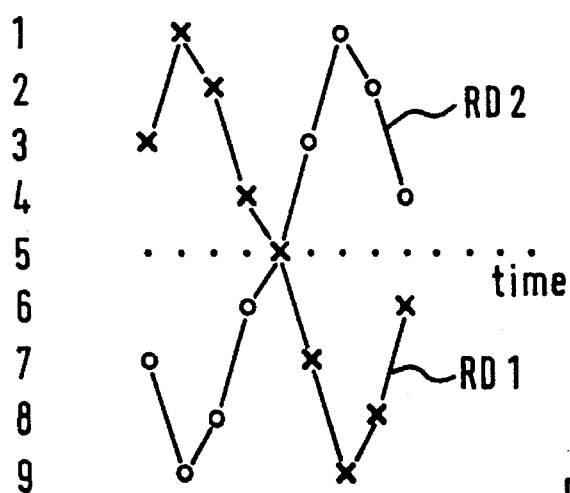

If the phase-encoding sequence is linearly selected, i.e., the individual segments are measured in chronological succession in the same way that they are arranged in the raw data matrix, then a pronounced discontinuity in the chronological acquisition segments is obtained at every second image. This becomes clear with reference to FIG. 13, where the relative point in time for each segment SG is shown (i.e., relative to the point in time of the first data acquisition within a raw data matrix). The data acquisition times for the first raw data matrix RD1 proceed linearly and continuously from segment to segment. When, for example, the four last segments from the first raw data matrix are transferred into the next raw data matrix RD2, then a pronounced discontinuity arises between the data acquisition times of the ninth and of the first segment of the second raw data matrix RD2, as may be clearly seen in FIG. 13. This discontinuity can be reduced by a corresponding re-ordering of the phase-coding steps. When, for example, according to FIG. 11, the phase coding is ordered such that the segments are measured in the sequence 3–1–2–4–5–7–9–8–6, then a curve of the relative data acquisition times for the raw data matrices RD1 and RD2 corresponding to FIG. 14 is obtained. In this case, all images have the same chronological filter function with a symmetry for every second image. This does not represent any problem for image data that are based on real values.

Figure 15:
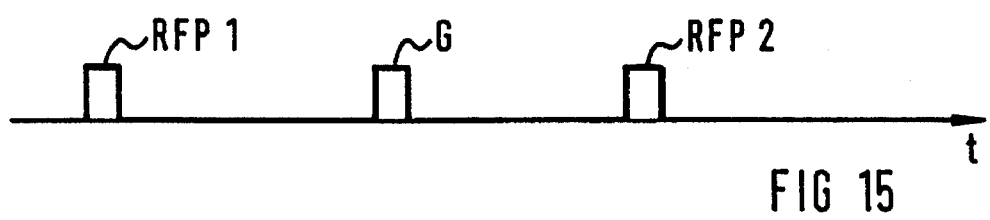
FIG. 15 shows a pulse sequence for spatially modulating the magnetization which can be used as preparation pulses to augment the inventive method.
Figure 16:
FIGS. 16–20 show a pulse sequence for time-resolved magnetic resonance imaging in accordance with the principles of the inventive method.
Figure 17:
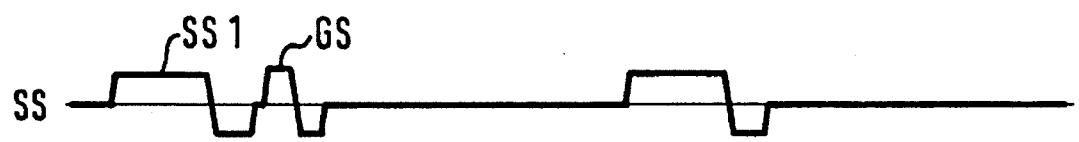
Figure 18:
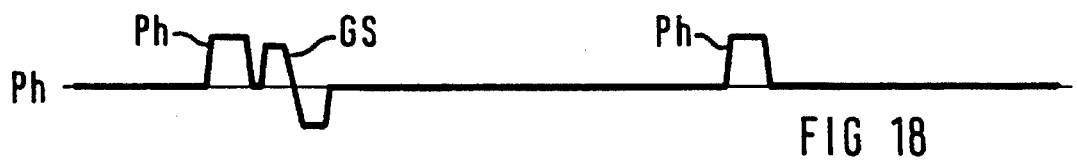
Figure 19:
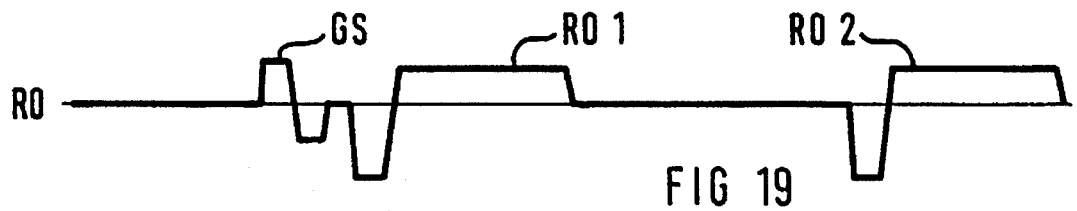
Figure 20:
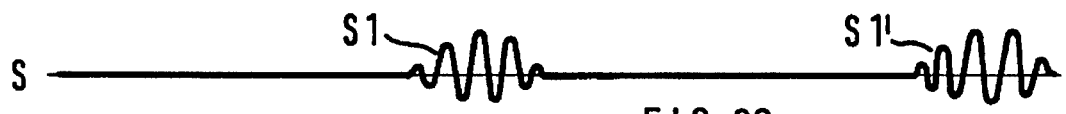

Special pulses for spin preparation can be introduced between the trigger signal triggered by the R-wave and the actual acquisition of measured values. Such preparation pulses are generally composed of a combination of RF pulses and gradient pulses. Specific contrasts or intensity distributions can thus be produced. For example, a spatial modulation of the magnetization can be achieved by a pulse sequence shown in FIG. 15 and composed of two radio-frequency pulses RFP1, RFP2 and an intervening gradient pulse G. This is disclosed in detail in U.S. Pat. No. 5,054,489. Given a corresponding dimensioning of the pulses, a grid-like saturation of the magnetization arises, this being expressed by dark lines in the image. These dark lines can now be tracked over the course of the cardiac cycle, an examination of the cardiac wall motion being indirectly derivable therefrom. These examinations can be implemented with high chronological resolution within a breath-holding cycle with the assistance of the data acquisition technique of the invention, so that artifacts due to respiratory motion can be relatively easily avoided.

As is known, the arising nuclear magnetic resonance signals are acquired phase-dependent in MR imaging. The evaluation of the phase in the individual cardiac phase images enables a determination of the flow rate. Since the phase of the nuclear magnetic resonance signal, however, is dependent on other quantities in addition to being dependent on the rate, it is recommended to utilize a phase contrast technique wherein excitations with flow compensation and with flow dependency occur in alternation.

A corresponding pulse sequence is shown in FIGS. 16–20. As in the case of the pulse sequence of FIGS. 1–5, a radio-frequency pulse RF is also emitted under a slice selection gradient SS. The nuclear spins are phase-encoded by phase-encoding gradients Ph, are dephased by a read-out gradient RO in the negative direction, and are in turn re-phased by reversal of this gradient, so that a nuclear magnetic resonance signal S arises. Differing from the pulse sequence of FIGS. 1–5, however, a bipolar gradient GS in the slice selection direction is provided after every other excitation, making the following nuclear magnetic resonance signal S1 phase-dependent with respect to the rate or flow. Only a flow-dependent term remains given the subtraction of two successive signals S1 and S1', European Patent 0 115 642 is referenced for a more detailed disclosure of the phase contrast technique.

Figure 21:
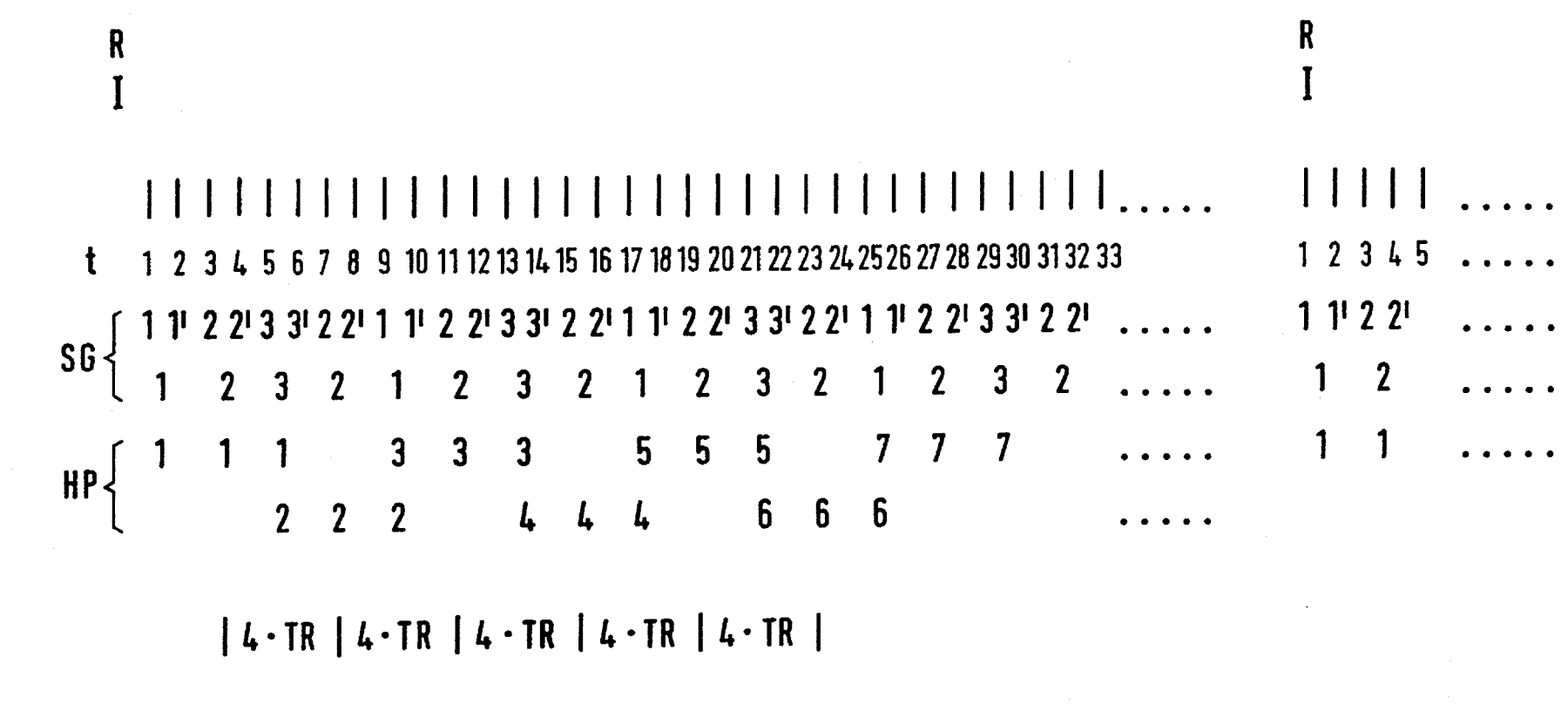

FIG. 21 shows an applied example of the flow measurement in combination with the described, segmented data acquisition given multiple employment of nuclear magnetic resonance signals. For clarity, one doubly-employed echo thereby forms the basis of only three segments. In FIG. 21, an unprimed number identifies a raw data row of the corresponding segment with flow compensation and a number having a prime identifies a raw data row that was acquired from a sequence having flow dependency. After pair-by-pair subtraction of the raw data, the individual segments are combined to form a raw data set at the respective cardiac phase HP, whereby one segment is again employed for two neighboring raw data sets, as shown in FIG. 21.

Figure 22:
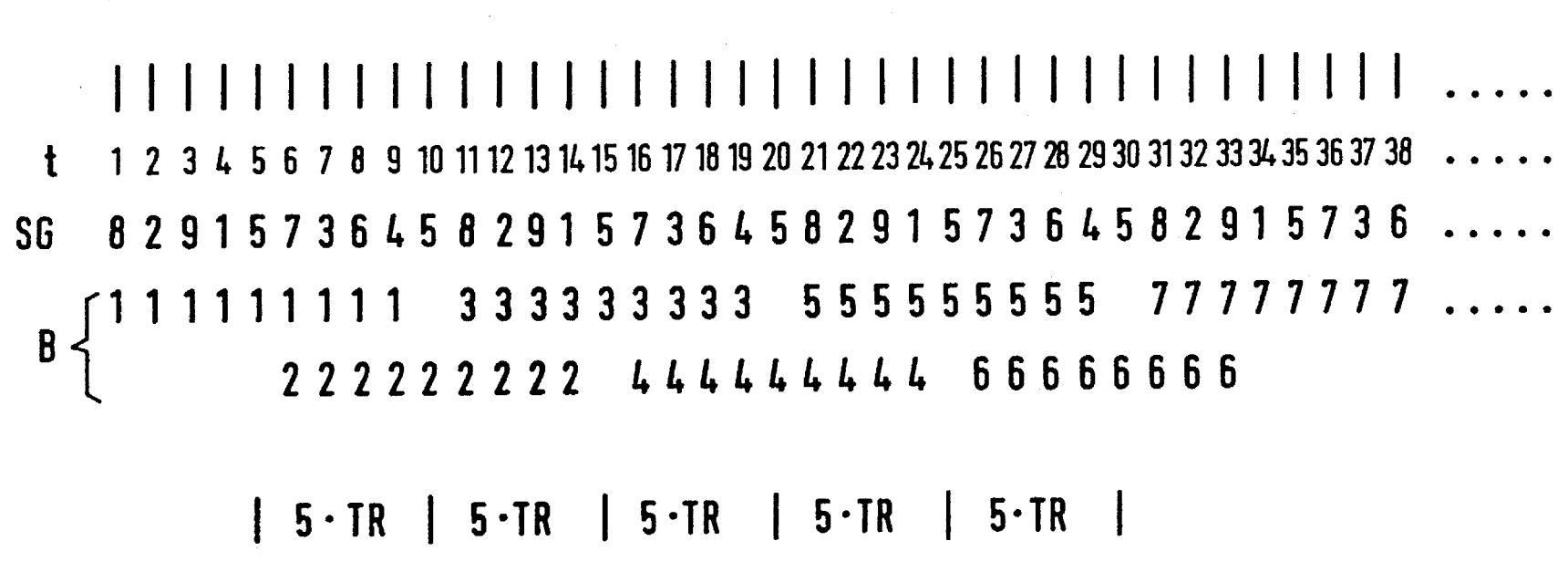

The multiple employment of nuclear magnetic resonance signals for successive raw data sets can also be advantageously utilized given untriggered measurements, particularly for the examination of rapidly sequencing events. For example, rapidly sequencing events must be measured with high chronological resolution for perfusion measurements or in functional imaging. FIG. 22 shows such a measuring sequence. The raw data sets are thereby divided into nine segments SG, each having n raw data rows that are measured immediately after one another. The total number of raw data rows thus amounts to 9× n. As shown in FIG. 22, respectively four segments are divided between chronologically successive images B, so that the chronological spacing dt between two measurements only amounts to dt=5×n×TR, instead of 9×n×TR in the conventional case. As already set forth with reference to the exemplary embodiments for periodic measurements, of course, the number of segments overall and the number of segments employed in common can be varied in accord with the respective requirements of the measurement.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for time-resolved imaging with nuclear magnetic resonance signals, comprising the steps of:

exciting and phase-encoding nuclear spins in a subject to produce nuclear magnetic resonance signals;

reading out said nuclear magnetic resonance signals from said subject;

entering said nuclear magnetic resonance signals dependent on their phase-encoding into respective rows of a raw data matrix divided into a plurality of segments by entering said signals into central rows of a raw data matrix and into upper edge rows and into lower edqe rows of said raw data matrix;

producing a plurality of said raw data matrices at different points in time of a motion sequence of said subject;

entering signals, comprising at least one of said segments, in common into two chronologically successive raw data matrices by alternatingly entering nuclear magnetic resonance signals from a segment in an upper edge row of a raw data matrix into a successive raw data matrix and entering nuclear magnetic resonance signals from a segment in a lower edge row of said successive raw data matrix into a next successive raw data matrix; and producing an image from each of said raw data matrices.

2. A method as claimed in claim 1 wherein said motion sequence comprises a plurality of successive, periodic events, and comprising the additional step of:

dividing a period of each event into a plurality of motion phases;

generating a trigger pulse for initiating generation and acquisition of said nuclear magnetic resonance signals at a beginning of each motion phase, said plurality of raw data matrices and images corresponding in number to said plurality of motion phases, and wherein the step of entering said nuclear magnetic resonance signals into a raw data matrix comprises entering said nuclear magnetic resonance signals respectively into said central rows, said upper edge rows and said lower edge rows of a raw data matrix during each motion phase.

3. A method as claimed in claim 2 comprising the step of phase-encoding said nuclear magnetic resonance signals for causing said segments to be uniformly distributed within each raw data matrix at equal chronological intervals following each trigger pulse.

4. A method as claimed in claim 1 comprising the additional steps of:

reading out a first set of nuclear magnetic resonance signals with flow compensation and a second set of nuclear magnetic resonance signals with flow dependency;

subtracting said first and second sets of nuclear magnetic resonance signals to obtain a set of difference signals; and entering said difference signals into said raw data matrices as said nuclear magnetic resonance signals.

5. A method as claimed in claim 1 comprising the additional step of:

emitting preparation pulses into said subject comprised of radio-frequency pulses before exciting said nuclear magnetic spins in said subject.

6. A method as claimed in claim 1 comprising the additional step of:

emitting preparation pulses into said subject comprised of gradient pulses before exciting said nuclear magnetic spins in said subject.

7. A method as claimed in claim I comprising the additional step of:

emitting preparation pulses into said examination subject consisting of a radio-frequency pulse, a gradient pulse and a further radio-frequency pulse in chronological succession, before exciting said nuclear magnetic spins in said examination subject.

* * * * *